United States Patent [19]

Gale et al.

[11] Patent Number: 4,534,620
[45] Date of Patent: Aug. 13, 1985

[54] STANDARDIZED MULTI-STACK DIELECTRIC-LAYER FILTER BLANK AND METHOD FOR FABRICATING COLOR-ENCODING FILTER THEREFROM

[75] Inventors: Michael T. Gale, Wettswil; Hans W. Lehmann, Hedingen, both of Switzerland

[73] Assignee: RCA Corporation, Princeton, N.J.

[21] Appl. No.: 512,541

[22] Filed: Jul. 11, 1983

[51] Int. Cl.³ .............................................. G02B 5/28
[52] U.S. Cl. ..................................... 350/166; 350/320
[58] Field of Search ............ 350/164, 166, 320, 162.19

[56] References Cited

FOREIGN PATENT DOCUMENTS 1206317 2/1960 France .

Primary Examiner—Bruce Y. Arnold
Attorney, Agent, or Firm—Joseph S. Tripoli; George E. Haas; George J. Seligsohn

[57] ABSTRACT

A green-manifesting blank comprised of yellow and cyan dielectric stacks, one on top of the other, supported by a transparent substrate can be used to fabricate a green, yellow or cyan, and white color-encoding filter having any arbitrary given spatial pattern by combining dry-etching and wet etching, if the top layer of the bottom stack is composed of a material which is inert to a given wet etchant and the bottom layer of the top stack is composed of a material which is etched by the given wet etchant. Alternatively, the wet etching can be dispensed with if, after completion of the color-encoding filter, the filter is covered with an overcoat material exhibiting an index-of-refraction substantially equal to that of the bottom layer of the top stack.

19 Claims, 3 Drawing Figures

STANDARDIZED MULTI-STACK DIELECTRIC-LAYER FILTER BLANK AND METHOD FOR FABRICATING COLOR-ENCODING FILTER THEREFROM

This invention relates to a standardized (preferably green-manifesting) dielectric filter blank for use in fabricating therefrom a color-encoding transmissive filter that exhibits any arbitrary given spatial pattern.

As known in the art, color television cameras must be able to detect light of at least three independent colors from which red, green and blue signals can be directly or indirectly derived. Television cameras can utilize a separate imager (vidicon or solid state) for detecting each of the three independent colors, or, alternatively, they can utilize only a single imager (or in some cases two imagers) together with a color-encoding filter for detecting each of the three independent colors. Such color-encoding filters are often comprised of a spatial pattern of color stripes. Other spatial pattern arrangements of color regions can also be utilized. For instance, in the case of a solid state imager comprised of a matrix of photodetecting picture elements arranged in rows and columns (such as a CCD imager, by way of example), the configuration of the variously colored regions of the spatial pattern are designed to cooperate with the respective discrete picture elements of the matrix to provide a good quality color television picture. Thus, a change in color television camera design can require a change in the configuration arrangement of the spatial pattern of the color-encoding filter therefor.

The encoding filters employed in color television cameras are transmissive. They may be fabricated using dyes or dielectric (multilayer interference filter) structures. The dielectric structures are somewhat more expensive, but have the advantage that they are efficient, absorption-free, do not bleach or degrade with time and are relatively hard (scratch resistant). Additionally, the transmission characteristics of a dielectric filter can be readily varied (tuned) by adjusting the layer thicknesses during manufacture.

To manufacture many dielectric filters all of which have precisely the same set of layer thicknesses as one another (hence precisely the same transmission characteristics as one another) requires sophisticated instrumentation and techniques on the part of the manufacturer. The per unit cost of manufacturing a standardized multilayer dielectric color filter blank in high volume is relatively low. However, the per unit cost of manufacturing a color-encoding dielectric filter having a particular configuration spatial pattern of colored regions in low volume is relatively high. The present invention is directed to a transmissive dielectric filter configuration comprising a plurality of dielectric stacks. The plurality of dielectric stacks include a first multilayer interference dielectric stack supporting an overlying second multilayer interference stack, with the bottom layer of the second stack being in direct contact with the top layer of the first stack. The first stack, by itself, transmits light of a first color spectrum (for example, one of cyan or yellow); the second stack, by itself, transmits light of a second color spectrum (for example, the other of yellow or cyan) that partially overlaps the first color spectrum (i.e., the spectra of both cyan and yellow include green). Therefore, the first and second stacks, together, transmit light of a third color spectrum (green) that corresponds to the overlap of the first and second color spectrums. All layers of both the first and second stacks are dry etched by a given dry etching process.

The present invention is further directed to a method for selectively removing at least one region of solely the second stack without affecting the underlying first stack. This method comprises the steps of dry etching the selected region (or regions) to remove all but a portion of the bottom layer of the second stack only within a selected region (or regions) of the second stack. This portion of the bottom layer of the second stack is at least optically effectively removed only within the selected region (or regions) without affecting the underlying top layer of the first stack. If desired, a selected part of the selected region (or regions) of the first stack can be dry etched to remove all of the layers of the first stack only within the selected part of the region (or regions). This is useful in fabricating a color-encoding transmissive filter from a standardized dielectric filter blank.

Figure 1:
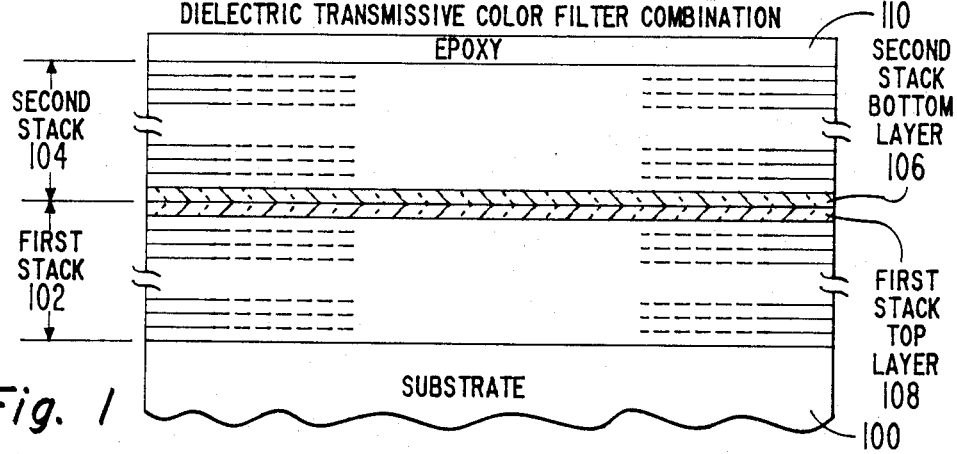
FIG. 1 is a diagram illustrating the embodiment of a standardized multilayer interference dielectric transmissive color filter combination incorporating the present invention.

A standardized dielectric color filter combination, in accordance with the principles of the present invention, comprises a plurality of at least two dielectric transmissive color filter stacks, with the stacks being arranged one on top of the other. More specifically, as shown in FIG. 1, a transparent substrate (composed of glass, plastic or other suitable material) supports a first stack 102 of a predetermined number of dielectric layers, with each layer having a specified thickness and each pair of contiguous layers being composed of dielectric materials of different indices-of-refraction. As known in the art of multilayer interference dielectric structure color filters, the thickness of each dielectric layer is designed in terms of the quarter-wavelength thickness for light of a specified color traveling in a material having the particular index-of-refraction of that dielectric layer. The color spectrum characteristics of the pass band of such a color filter is highly dependent on the accuracy with which the thickness of each of the respective dielectric layers in the stack is controlled during manufacture of the filter.

The color filter combination shown in FIG. 1 includes a second stack 104 situated on top of first stack 102, with second-stack bottom layer 106 being in contact with first-stack top layer 108. First stack 102 is designed to have a first predetermined color spectrum and second stack 104 is designed to have a second predetermined color spectrum which partially overlaps the first color spectrum. In accordance with a preferred embodiment of the present invention, one of first and second stacks 102 and 104 is designed to have a cyan color spectrum and the other of first and second stacks 102 is designed to have a yellow color spectrum. Therefore, in response to illumination by white light, such a color filter combination transmits therethrough only green light (since green is the only color component common to both yellow and cyan).

Although the color filter combination shown in FIG. 1 includes only first stack 102 and second stack 104, it should be understood that a color filter combination comprised of three or more stacks arranged one on top of another, is also contemplated by the present invention. In any case, it is desirable (although not essential) to cover the top layer of the top stack (such as second stack 104 in FIG. 1) with a protective layer of epoxy 110. The thickness of epoxy layer is very much larger than the input light wavelength, so that epoxy layer 110 does not form any part of the color filter stacks (such as first stack 102, second stack 104).

In accordance with one embodiment of the present invention, the top layer (such as first-stack top layer 108) of any underlying stack (such as first-stack 102) is comprised of a dielectric material (such $TiO_2$) which is inert to a given wet etchant (such as HF or concentrated HCl with small amounts of Zn powder added to produce nascent $H_2$). The bottom layer (such as second-stack bottom layer 106) of the overlying stack (such as second stack 104) in contact with the aforesaid underlying top layer is composed of a dielectric material (such as $SiO_2$ or $SnO_2$) which is wet etched by one of the aforesaid given wet etchant.

The design of a standardized color filter combination which is to be used in fabricating the color-encoding filter for a television camera must be optimized to produce filter transmission characteristics which themselves are optimum for application in a given camera. Below are first and second examples of standardized color filter combinations for use in fabricating a color-encoding (stripe) filter having optimized transmission characteristics for a single chip charge-coupled device (CCD) color camera employing the RCA SID 52 501 imager chip. In each of the first and second examples, the substrate is transparent glass and the index-of-refraction of each of substrate 100 and the epoxy layer 110 is approximately 1.5.

FIRST EXAMPLE

First stack 102 in the first example is a cyan filter having a design center wavelength $\lambda_1 = 565$ nm and second stack 104 is a yellow color filter having a design center wavelength $\lambda_2 = 465$ nm. The first and second stacks constitute alternating layers of $SiO_2$ having an index-of-refraction approximately equal to 1.46 and $TiO_2$ having an index-of-refraction of approximately 2.4. The first and second stacks, together, of the first example are comprised of nineteen layers of selective thicknesses of $TiO_2$ or $SiO_2$ set forth in the following table:

|  | Layer No. | $TiO_2$ | $SiO_2$ |
|---|---|---|---|
| SECOND STACK | Epoxy | (overcoat) |  |
|  | 1 | 29.4 nm |  |
|  | 2 |  | 48.3 |
|  | 3 | 58.8 |  |
|  | 4 |  | 48.3 |
|  | 5 | 58.8 |  |
|  | 6 |  | 48.3 |
|  | 7 | 58.8 |  |
|  | 8 |  | 48.3 |
|  | 9 | 29.4 |  |
|  | 10 | 145.0 |  |
| FIRST STACK | 11 | 96.8 |  |
|  | 12 |  | 59.2 |
|  | 13 | 96.8 |  |
|  | 14 |  | 59.2 |
|  | 15 | 96.8 |  |
|  | 16 |  | 59.2 |

| Layer No. | $TiO_2$ | $SiO_2$ |
|---|---|---|
| 17 | 96.8 |  |
| 18 |  | 59.2 |
| 19 | 96.8 |  |
| Substrate |  |  |

SECOND EXAMPLE

In the second example, the first and second stacks, together, are made up of only eighteen dielectric layers, with the bottom layer of the second stack being composed of $SnO_2$ (having an index-of-refraction of approximately 1.86). Otherwise, the first and second stacks are composed of alternating layers of $TiO_2$ (having an index-of-refraction of approximately 2.4 and $SiO_2$ an index-of-refraction of approximately 1.46). The respective thicknesses of the eighteen layers are set forth in the following table:

|  | Layer No. | $TiO_2$ | $SiO_2$ | $SnO_2$ |
|---|---|---|---|---|
| SECOND STACK | Epoxy | (overcoat) |  |  |
|  | 1 | 95.8 nm |  |  |
|  | 2 |  | 58.6 |  |
|  | 3 | 95.8 |  |  |
|  | 4 |  | 58.6 |  |
|  | 5 | 95.8 |  |  |
|  | 6 |  | 58.6 |  |
|  | 7 | 95.8 |  |  |
|  | 8 |  | 58.6 |  |
|  | 9 |  |  | 123.6 nm |
| FIRST STACK | 10 | 29.9 |  |  |
|  | 11 |  | 49.2 |  |
|  | 12 | 59.8 |  |  |
|  | 13 |  | 49.2 |  |
|  | 14 | 59.8 |  |  |
|  | 15 |  | 49.2 |  |
|  | 16 | 59.8 |  |  |
|  | 17 |  | 49.2 |  |
|  | 18 | 29.9 |  |  |
|  | Substrate |  |  |  |

Figure 2:
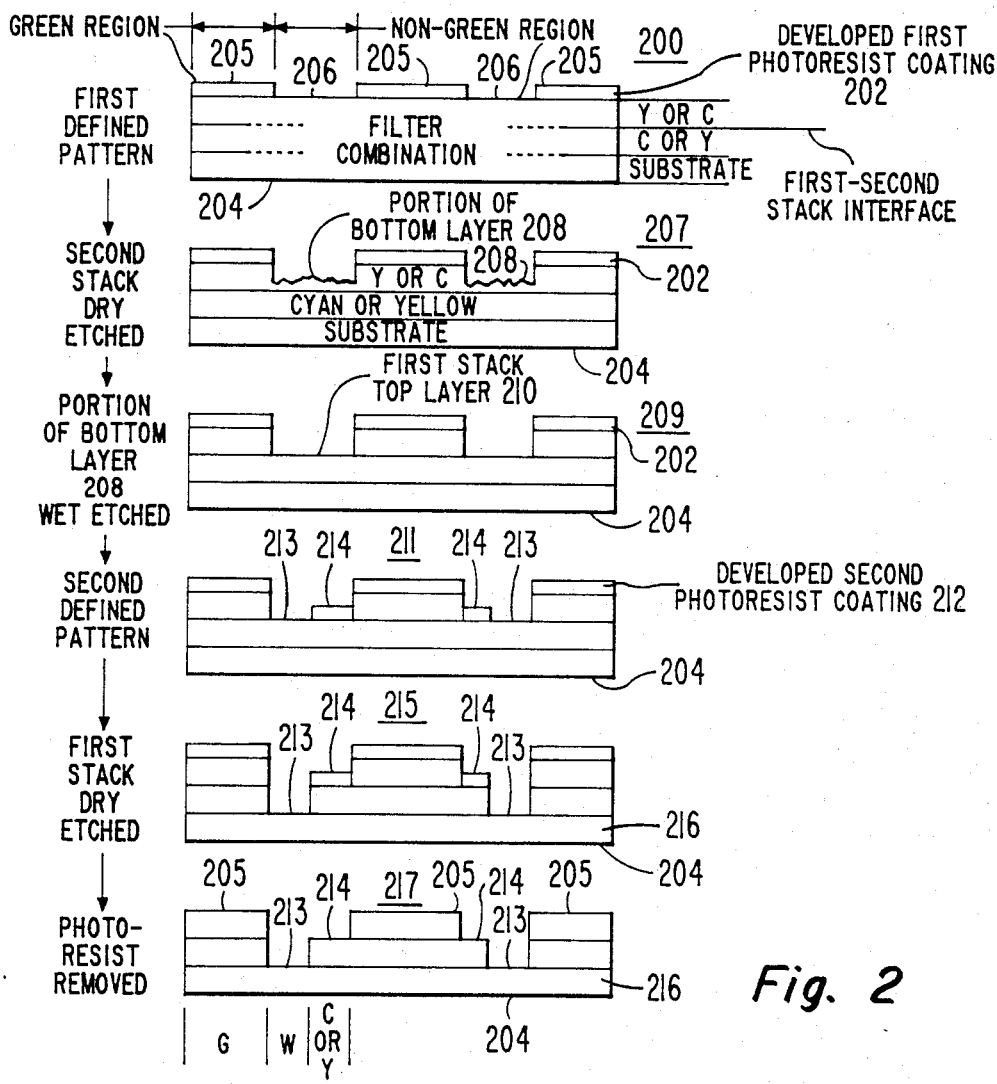
FIG. 2 is a diagram illustrating the method steps required to fabricate a three-color, color-encoding transmissive filter from the standardized color filter combination shown in FIG. 1.

All of the layers of both the first and second stacks can be dry etched by a dry-etching process (such as reactive sputter etching). Employing a method incorporating the present invention, a color-encoding transmissive filter that exhibits any arbitrary spatial pattern of three-color spatial regions over its surface area can be fabricated from a standardized dielectric filter blank, such as the standardized color filter combination shown in FIG. 1. The flow diagram of the steps of such a method are shown in FIG. 2, wherein it is assumed, for illustrative purposes, that the standarized color filter combination is a standardized green-manifesting dielectric filter blank having the specific structure defined in one of the two tables set forth above (in connection with the first and second examples of a standardized color filter combination). In this case, the arbitrary given spatial pattern of a color-encoding transmissive filter to be fabricated from the green-manifested blank comprises at least one spatial region manifesting green, at least one spatial region manifesting only a preselected certain one of cyan or yellow, and at least one spatial region manifesting white.

The first step is to define spatially on the blank solely the respective regions of the given spatial pattern that corresponds solely with all of the preselected certain one of cyan or yellow spatial regions and all of the white spatial regions. As shown in FIG. 2, the first step 200 can be achieved by means of a photoresist coating.

More specifically, the green-manifesting standardized filter combination blank is coated with photoresist (such as a 1-2 micrometer layer of Shipley AZ1350 positive photoresist) which is exposed with light defining the first spatial pattern (such as a grating mask with a line to space ratio of 1:2 to define a color stripe pattern) to derive the developed first photoresist coating 202 structure shown in FIG. 2. As indicated in first step 200, only those regions of the top surface of filter combination 204 which correspond to green regions 205 of the spatial pattern of the color-encoding filter to be fabricated remain coated by the first photoresist coating 202. Thus, all of the non-green regions 206 (i.e., the preselected one of yellow or cyan regions and the white regions of the spatial pattern) remain uncovered by developed first photoresist coating 202.

As indicated in second step 207, the non-green regions of the second stack of filter combination 204 are dry etched until only a portion of bottom layer 208 of the non-green regions 206 remains. At this point the dry etching of the second stack is terminated. The benefit of dry etching (such as reactive sputter etching) is that undercutting is avoided. The dry etching step is relatively non-critical. All that is required is that the dry etching of the second stack terminates before all of the bottom layer 208 is removed. The required depth of second-stack dry etching can be achieved by etching for a given time (after previous calibration runs or, preferably, by optical monitoring of the etching in an area outside the spatial pattern). The thickness of the remaining portion of bottom layer 208 can be quite small (less than 100 nm), although the exact thickness is non-critical.

As indicated in third step 209, the portion of bottom layer 208 is wet etched to entirely remove it and thereby reveal the first-stack top layer 210 within the non-green region 206. The bottom layer of the second stack is composed of material which is etchable by the given wet etchant, but the top layer of the first stack is composed of material which is inert to this given wet etching. Therefore, none of top layer 210 is wet etched, so that the color filtering properties of the first stack are totally unaffected by the wet etching of the remaining portion of bottom layer 208. Further, the dry etching followed by wet etching provides clean and uniform removal, thereby producing etched regions with perfectly sharp and vertical sidewalls. Specifically, since the thickness of the remaining portion of bottom layer 208 is small (less than 100 nm), lateral wet etching into the portion of the second-stack bottom layer underlying green regions 205 is negligible compared to the width of each green region (the width of a typical green line of a color-encoding stripe filter is approximately 30 micrometers).

The next step 211 employs a developed second photoresist coating 212 to provide a second spatial pattern which defines, within the non-green region 206, white regions 213 (which are not covered by developed second photoresist coating 212) and a preselected one of cyan or yellow regions 214 derived by the first step which remain covered by developed second photoresist coating 212.

Specifically, first photoresist coating 202 is removed, employing a suitable solvent, and then second photoresist coating 202 is added, exposed and developed to provide the second spatial pattern.

As indicated by step 215, all the layers of the first stack are dry etched only within white regions 213 to thereby reveal the underlying transparent substrate 216. The last step 217 is to remove the developed second photoresist coating 212, employing a suitable solvent, thereby to provide a completely fabricated color-encoding filter. As indicated in step 217, the green (G) regions 205 are comprised of the substrate, the first stack and the second stack of filter combination 204; white (W) regions 213 are comprised of only transparent substrate 216 of filter combination 204; and the cyan (C) or yellow (Y) regions 214 (with the preselected one of cyan or yellow being determined by the filter characteristics of the first stack) are comprised of only the substrate and the first stack of filter combination 204.

Utilizing this method, color-encoding filters having a stripe pattern have been fabricated from (see examples 1 and 2 discussed above) standardized filter combination blanks. In particular, the reactive sputter etching was carried out in a $CHClF_2$ plasma, which at a pressure of 15 mTorr etches $SiO_2$ at the rate of 17 nm/min. and $TiO_2$ at the rate of 22 nm/min. The removal of the portion of the bottom layer 208 by wet etching (step 209) was carried out by buffered HF (in the case of example 1) or by concentrated HCl to which a small amount of Zn had been added to produce nascent $H_2$ (in the case of example 2). Measurements were made of the W, C and G transmission characteristics of the resulting fabricated example 1 stripe filter and the W, Y and G transmission characteristics of the resulting fabricated example 2 stripe filter. These measurements demonstrated that the fabrication method of the present invention, without requiring any critical steps, was successful in removing all of the portion of bottom layer 208 without injury to any of the second stack underlying green regions 205 and without injury to the top layer of the first stack.

In FIG. 2, the wet etching step 209 is used to physically remove the portion of bottom layer 208 that remained after the completion of the second stack dry etching step 207, to thereby avoid the undesired effect that the presence of the portion of bottom layer 208 would have on the optical characteristics of a multi-color filter fabricated by the method steps of FIG. 2.

Figure 3:
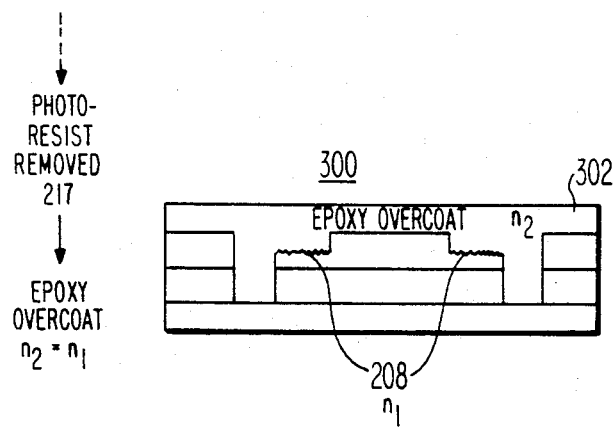
FIG. 3 is a diagram illustrating a modification of the method steps of FIG. 2.

FIG. 3 is directed to an alternative technique for substantially eliminating the optical effect of the portion of bottom layer 208 (shown in FIG. 2) on the characteristics of a multi-color filter, without physically removing the portion of bottom layer 208. This alternative technique employs all the method steps of FIG. 2, with the exception of wet-etching step 209. Further, this alternative technique employs, as a final method step (following the photoresist removal step 217 of FIG. 2), step 300, shown in FIG. 3. As shown in FIG. 3, the portion of bottom layer 208 is still present after removal of photoresist 217 is completed, since wet-etching step 209 has been skipped. Layer 208, as indicated, exhibits an index-of-refraction n. An epoxy overcoat 302 is added by step 300. Overcoat 302, which is in intimate contact with the portion of bottom layer 208, exhibits an index-of-refraction $n_2$. An epoxy is selected for overcoat 302 in which the index-of-refraction $n_2$ matches the index-of-refraction $n_1$ of the bottom layer 208 material (i.e., $n_2$ substantially equals $n_1$). The result is that optically the portion of bottom layer 208 is effectively removed.

What is claimed is:
1. A standardized green-manifesting dielectric filter blank having a given surface area for use in fabricating therefrom a color-encoding transmissive filter that ex- hibits any arbitrary given spatial pattern over said given surface area, which spatial pattern comprises at least one spatial region manifesting green, at least one spatial region manifesting only a preselected certain one of cyan or yellow, and at least one spatial region manifesting white; said blank comprising:

a transparent substrate having a surface of at least said given area;

a first dielectric filter in contact with and substantially entirely covering all of said given surface area of said substrate, said first dielectric filter comprising a first stack of a plurality of dielectric layers having respective specified thicknesses and exhibiting respective indices-of-refraction such that only said preselected certain one of cyan-manifesting light or yellow-manifesting light is transmitted through said first stack, the top layer of said first stack being comprised of a first dielectric material which is inert to a given wet etchant;

a second dielectric filter in contact with and substantially entirely covering all of said top layer of said first stack, said second dielectric filter comprising a second stack of a plurality of dielectric layers having respective specified thicknesses and exhibiting respective indices-of-refraction such that only the other one of said preselected certain one of cyan-manifesting light and yellow-manifesting light is transmitted through said second stack, the bottom layer of said second stack (1) being in contact with said top layer of said first stack and (2) being composed of a second dielectric material which is etchable by said given wet etchant, and;

wherein all of said layers of both said first and second stacks are etchable by a given dry etching process.

2. The filter blank defined in claim 1, wherein said blank further includes a protective epoxy layer overcoat in contact with and substantially covering said given area of the top layer of said second stack, said epoxy layer having a thickness which is much larger than any light wavelength in the visible spectrum.

3. The filter blank defined in claim 1, wherein said preselectered certain one of cyan-manifesting light and yellow-manifesting light is cyan-manifesting light; and said top layer of said first stack is TiO2 and said bottom layer of said second stack is SiO2.

4. The filter blank defined in claim 3, wherein each of said first stack and said second stack is entirely comprised of alternating layers of TiO2 and SiO2.

5. The filter blank defined in claim 4, wherein:

said filter blank further includes a protective epoxy layer overcoat in contact with and substantially covering said given area of the top layer of said second stack, said epoxy layer having a thickness which is much larger than any light wavelength in the visible spectrum;

said substrate and said overcoat each exhibit an index-of-refraction of substantially 1.5, SiO2 exhibits an index-of-refraction of 1.46 and TiO2 exhibits an index-of-refraction of substantially 2.4; and said first and second stacks together consist of 19 layers having respective thicknesses and composition, beginning with the top layer of said second stack in contact with said overcoat and ending with the bottom layer of said first stack in contact with said substrate, substantially in accordance with the following list:

|  | Layer No. | TiO2 | SiO2 |
|---|---|---|---|
| SECOND STACK | Epoxy | (overcoat) |  |
|  | 1 | 29.4 nm |  |
|  | 2 |  | 48.3 |
|  | 3 | 58.8 |  |
|  | 4 |  | 48.3 |
|  | 5 | 58.8 |  |
|  | 6 |  | 48.3 |
|  | 7 | 58.8 |  |
|  | 8 |  | 48.3 |
|  | 9 | 29.4 |  |
|  | 10 | 145.0 |  |
| FIRST STACK | 11 | 96.8 |  |
|  | 12 |  | 59.2 |
|  | 13 | 96.8 |  |
|  | 14 |  | 59.2 |
|  | 15 | 96.8 |  |
|  | 16 |  | 59.2 |
|  | 17 | 96.8 |  |
|  | 18 |  | 59.2 |
|  | 19 | 96.8 |  |
|  | Substrate |  |  |

6. The filter blank defined in claim 5, wherein said substrate is glass.

7. The filter blank defined in claim 3, wherein said given wet etchant is buffered HF.

8. The filter blank defined in claim 1, wherein:

said preselected certain one of cyan-manifesting light and yellow-manifesting light is yellow-manifesting light; and said top layer of said first stack is TiO2, and said bottom layer of said second stack is SnO2.

9. The filter blank defined in claim 8, wherein:

said first stack is entirely composed of alternating layers of TiO2 and SiO2; and said second stack, except for its bottom layer, is composed alternating layers of SiO2 and TiO2 with an SiO2 layer of said second stack being in contact with said SnO2 bottom layer of said second stack.

10. The filter blank defined in claim 9, wherein:

said blank further includes a protective epoxy layer overcoat in contact with and substantially covering said given area of the top layer of said second stack, said epoxy layer having a thickness which is much larger than any light wavelength in the visible spectrum;

said substrate and said overcoat each exhibit an index-of-refraction of about 1.5, SiO2 exhibits an index-of-refraction of substantially 1.46, TiO2 exhibits an index-of-refraction of substantially 2.4, and SnO2 exhibits an index-of-refraction of substantially 1.86; and said first and second stacks together consist of 18 layers having respective thicknesses and composition, beginning with the top layer of second stack in contact with said overcoat and ending with the bottom layer of said first stack in contact with said substrate, substantially in accordance with the following list:

|  | Layer No. | TiO2 | SiO2 | SnO2 |
|---|---|---|---|---|
| SECOND STACK | Epoxy | (overcoat) |  |  |
|  | 1 | 95.8 nm |  |  |
|  | 2 |  | 58.6 |  |
|  | 3 | 95.8 |  |  |
|  | 4 |  | 58.6 |  |
|  | 5 | 95.8 |  |  |
|  | 6 |  | 58.6 |  |
|  | 7 | 95.8 |  |  |

-continued

|  | Layer No. | TiO$_2$ | SiO$_2$ | SnO$_2$ |
|---|---|---|---|---|
|  | 8 |  | 58.6 |  |
|  | 9 |  |  | 123.6 nm |
| FIRST STACK | 10 | 29.9 |  |  |
|  | 11 |  | 49.2 |  |
|  | 12 | 59.8 |  |  |
|  | 13 |  | 49.2 |  |
|  | 14 | 59.8 |  |  |
|  | 15 |  | 49.2 |  |
|  | 16 | 59.8 |  |  |
|  | 17 |  | 49.2 |  |
|  | 18 | 29.9 |  |  |
|  | Substrate |  |  |  |

11. The filter blank defined in claim 10, wherein said substrate is glass.

12. The filter blank defined in claim 8, wherein said given wet etchant is concentrated HCl to which small amounts of Zn are added to produce nascent H$_2$.

13. A method for fabricating a color-encoding transmissive green-manifesting dielectric filter from a standarized green-manifesting dielectric filter blank, said blank having a given surface area for use in fabricating therefrom a color-encoding transmissive filter that exhibits any arbitrary given spatial pattern over said given surface area, which spatial pattern comprises at least one spatial region manifesting green, at least one spatial region manifesting only a preselected certain one of cyan or yellow, and at least one spatial region manifesting white; wherein said blank comprises a transparent substrate having a surface of at least said given area; a first dielectric filter in contact with and substantially entirely covering all of said given surface area of said substrate, said first dielectric filter comprising a first stack of a plurality of dielectric layers having respective specified thicknesses and exhibiting respective indices-of-refraction such that only said preselected certain one of cyan-manifesting light or yellow-manifesting light is transmitted through said first stack, the top layer of said first stack being comprised of a first dielectric material which is inert to a given wet etchant; a second dielectric filter in contact with and substantially entirely covering all of said top layer of said first stack, said second dielectric filter comprising a second stack of a plurality of dielectric layers having respective specified thicknesses and exhibiting respective indices-of-refraction such that only the other one of said preselected certain one of cyan-manifesting light and yellow-manifesting light is transmitted through said second stack, the bottom layer of said second stack (1) being in contact with said top layer of said first stack and (2) being composed of a second dielectric material which is etchable by said given wet etchant; and wherein all of said layers of both said first and second stacks are etchable by a given dry etching process; said method comprising the steps of:

first, defining spatially on said blank solely the respective spatial regions of said given spatial pattern that correspond solely with all said preselected certain one of cyan or yellow spatial regions and all said white spatial regions;

second, dry etching solely said first defined spatial regions of said second stack to remove all but a portion of the bottom layer of said second stack only within said first-defined spatial regions of said second stack;

third wet etching said portion of the bottom layer of said second stack with said given wet etchant to remove all of said portion of the bottom layer of said second stack only within said first defined spatial regions thereby to reveal the underlying top layer of said first stack without etching any of said top layer of said first stack;

fourth, defining spatially solely those first defined revealed spatial regions of said top layer of said first stack that correspond solely to said white spatial regions, and fifth, dry etching said step-four defined spatial regions of said first stack to remove all of the layers of said first stack only within said second-defined spatial regions thereby to reveal the underlying substrate only within said second-defined spatial regions.

14. The method defined in claim 13, wherein said top layer of said first stack is composed of TiO$_2$ and said bottom layer of said second stack is composed of SiO$_2$, and wherein the step of wet etching comprises wet etching said portion of said bottom layer of said second stack with buffered HF.

15. The method defined in claim 13, wherein said top layer of said first stack is composed of TiO$_2$ and the bottom layer of said second stack is composed of SnO$_2$, and wherein said step of wet etching said portion of said bottom layer of said second stack with concentrated HCl to which a small amount of Zn is added to produce nascent H$_2$.

16. The method defined in claim 13, wherein said step of dry etching solely said first defined spatial regions of said second stack comprises the step of removing all but a portion of the bottom layer of said second stack having a thickness of the order of 100 nanometers.

17. A method for fabricating a multi-colored filter from a transmissive dielectric filter blank configuration comprising a plurality of dielectric stacks for use in fabricating a color-encoding filter therefrom, said blank configuration including: a first multilayer interference dielectric stack supporting an overlying second multilayer interference dielectric stack with the bottom layer of said second stack being directly in contact with the top layer of said first stack, said first stack by itself transmitting light of a first color spectrum and said second stack by itself transmitting light of a second color spectrum that partially overlaps said first color spectrum, whereby said first and second stacks together transmit light of a third color spectrum that corresponds only with the overlap of said first and second color spectra and wherein all layers of both said first and second stacks are dry etched by a given dry etching process; said method comprising the steps of:

dry etching at least one selected region of said second stack to remove all but a portion of the bottom layer of said second stack only within said selected regions of said second stack; and at least optically effectively removing said portion of the bottom layer of said second stack only within said selected regions of said second stack without affecting any of said top layer of said first stack.

18. The method defined in claim 17, wherein said filter blank configuration includes a top layer of said first stack which is composed of a first material which is inert to a given wet etchant and a bottom layer of said second stack which is composed of a second material which is wet etched by said given wet etchant, and wherein said step of at least optically effectively removing comprises the step of:

physically removing by wet etching said portion of the bottom layer of said second stack only within said selected regions of said second stack to remove all of said portion of the bottom layer only within said selected regions and thereby reveal the underlying top layer of said first stack only within said selected regions without affecting any of said top layer of said first stack.

19. The method defined in claim 17, wherein said filter blank configuration includes a bottom layer of said second stack exhibiting a given index-of-refraction, and wherein said step of at least optically effectively removing includes the step of:

covering said portion of the bottom layer of said second stack only within said selected regins of the bottom layer of said second stack with a given transparent material that is in intimate contact with said portion of the bottom layer of said second stack, said given material exhibiting an index-of-refraction substantially equal to said given index-of-refraction.

* * * * *